United States Patent
Iwata et al.

(10) Patent No.: US 9,786,804 B2
(45) Date of Patent: Oct. 10, 2017

(54) THIN-FILM SOLAR CELL AND PRODUCTION METHOD FOR THIN-FILM SOLAR CELL

(71) Applicant: Solar Frontier K.K., Tokyo (JP)

(72) Inventors: Yasuaki Iwata, Tokyo (JP); Hiroki Sugimoto, Tokyo (JP); Hideki Hakuma, Tokyo (JP)

(73) Assignee: Solar Frontier K.K., Tokyo (JP)

( * ) Notice: Subject to any disclaimer, the term of this patent is extended or adjusted under 35 U.S.C. 154(b) by 0 days.

(21) Appl. No.: 14/904,034

(22) PCT Filed: Jun. 19, 2014

(86) PCT No.: PCT/JP2014/066310
§ 371 (c)(1),
(2) Date: Jan. 8, 2016

(87) PCT Pub. No.: WO2015/005091
PCT Pub. Date: Jan. 15, 2015

(65) Prior Publication Data
US 2016/0155878 A1    Jun. 2, 2016

(30) Foreign Application Priority Data
Jul. 12, 2013  (JP) .................................. 2013-147092

(51) Int. Cl.
*H01L 31/00* (2006.01)
*H01L 31/0749* (2012.01)
(Continued)

(52) U.S. Cl.
CPC ........ *H01L 31/0749* (2013.01); *C23C 14/185* (2013.01); *C23C 14/5866* (2013.01);
(Continued)

(58) Field of Classification Search
CPC ...................... H01L 31/0322; H01L 31/03923
(Continued)

(56) References Cited

U.S. PATENT DOCUMENTS 5,141,564 A * 8/1992 Chen ................... H01L 31/0392
                                                          136/258
5,981,868 A    11/1999 Kushiya et al.
(Continued)

FOREIGN PATENT DOCUMENTS

JP         9-213977        8/1997
JP         10-135495       5/1998
(Continued)

OTHER PUBLICATIONS

International Search Report mailed Aug. 5, 2014, directed to International Application No. PCT/JP2014/066310, 2 pages.
(Continued)

*Primary Examiner* — Niki Bakhtiari
(74) *Attorney, Agent, or Firm* — Morrison & Foerster LLP

(57) ABSTRACT

A thin-film solar cell comprising a substrate, a first electrode layer arranged upon the substrate, a p-type light absorption layer formed by a group I-III-IV$_2$ compound arranged upon the first electrode layer, and an n-type second electrode layer arranged upon the p-type light absorption layer. The p-type light absorption layer includes Cu as a group 1 element and includes Ga and In as group III elements. The ratio of the atomic number between Cu and the group III elements in the entire p-type light absorption layer is lower than 1.0; the ratio of the atomic number between Ga and the group III elements in the surface on the second electrode layer side is no more than 0.13; and the ratio of the atomic number between Cu and the group III elements in the surface on the second electrode layer side is at least 1.0.

3 Claims, 6 Drawing Sheets

(51) Int. Cl.
  *H01L 31/032* (2006.01)
  *H01L 31/0392* (2006.01)
  *H01L 31/18* (2006.01)
  *H01L 31/065* (2012.01)
  *H01L 21/02* (2006.01)
  *C23C 14/18* (2006.01)
  *C23C 14/58* (2006.01)
  *C23C 28/00* (2006.01)

(52) U.S. Cl.
  CPC ........ *C23C 28/32* (2013.01); *H01L 21/02568* (2013.01); *H01L 21/02614* (2013.01); *H01L 31/0322* (2013.01); *H01L 31/03923* (2013.01); *H01L 31/03928* (2013.01); *H01L 31/065* (2013.01); *H01L 31/18* (2013.01); *Y02E 10/541* (2013.01); *Y02P 70/521* (2015.11)

(58) Field of Classification Search
  USPC .................................................. 136/243–265
  See application file for complete search history.

(56) References Cited

U.S. PATENT DOCUMENTS

| | | |
|---|---|---|
| 2007/0289624 A1 | 12/2007 | Kuriyagawa et al. |
| 2009/0242022 A1 | 10/2009 | Yonezawa |
| 2014/0069492 A1* | 3/2014 | Abe .................... H01L 31/0322 136/255 |
| 2015/0380596 A1 | 12/2015 | Nishii et al. |

FOREIGN PATENT DOCUMENTS

| | | |
|---|---|---|
| JP | 10-135498 | 5/1998 |
| JP | 2006-49768 | 2/2006 |
| JP | 2013-115119 | 6/2013 |
| WO | WO-2012/176589 | 12/2012 |
| WO | WO-2014/125902 | 8/2014 |

OTHER PUBLICATIONS

Extended European Search Report dated Jan. 17, 2017, directed to EP Application No. 14822465.2; 11 pages.

* cited by examiner

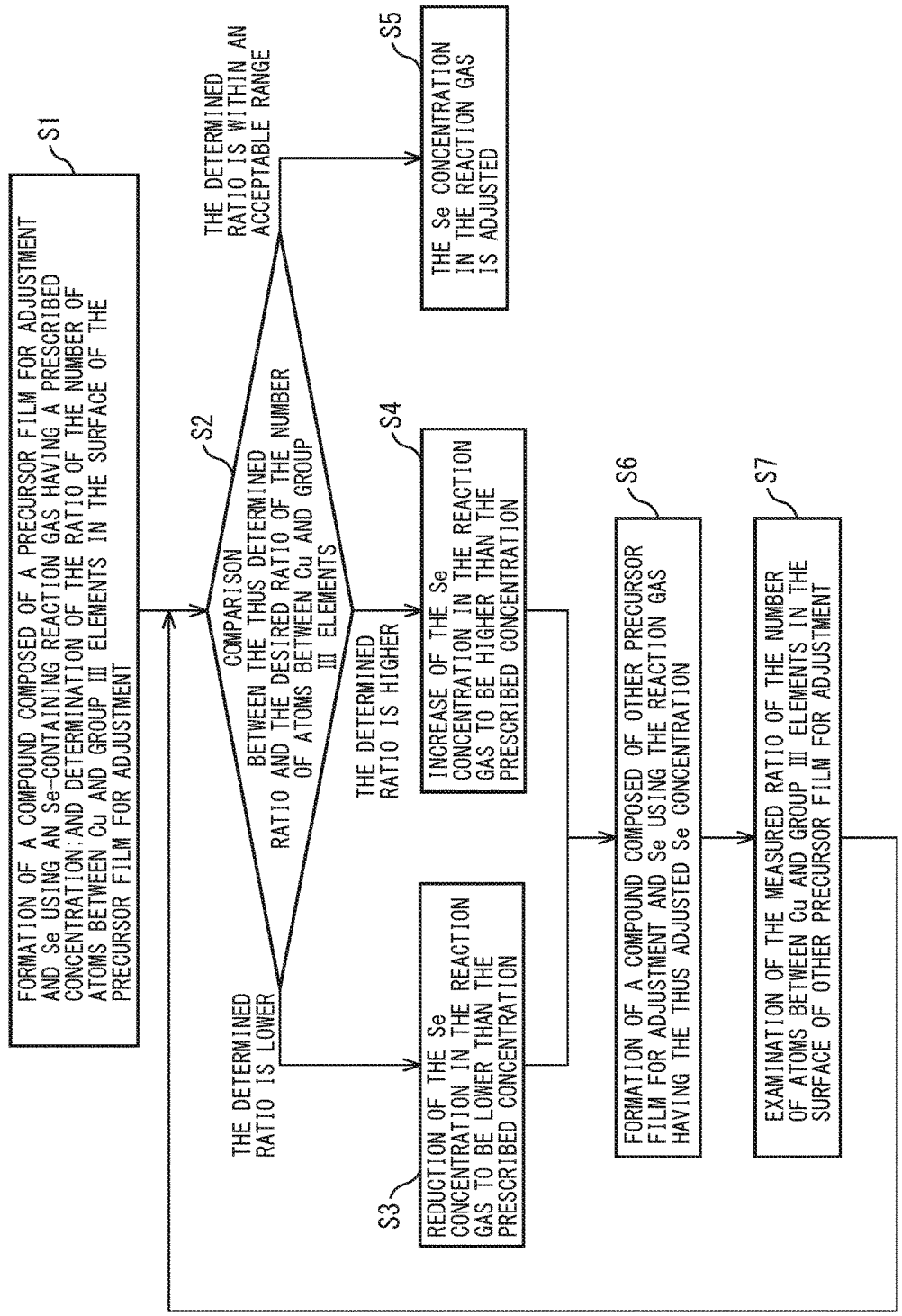

FIG. 5

| | Eff [%] | Voc/cell [mV] | Jsc [mA] | Voc×Jsc [mW] | FF | RATIO OF THE NUMBER OF ATOMS IN INTERFACE | |
|---|---|---|---|---|---|---|---|
| | | | | | | C2 | G2 |
| EXAMPLE 1 | 15.7 | 669 | 35.0 | 23.4 | 0.671 | 1.00 | 0.06 |
| EXAMPLE 2 | 15.5 | 683 | 33.2 | 22.7 | 0.683 | 1.10 | 0.07 |
| EXAMPLE 3 | 15.6 | 668 | 33.4 | 22.3 | 0.700 | 1.10 | 0.13 |
| COMPARATIVE EXAMPLE 1 | 14.7 | 686 | 31.6 | 21.7 | 0.680 | 0.94 | 0.10 |
| COMPARATIVE EXAMPLE 2 | 14.1 | 683 | 30.9 | 21.1 | 0.666 | 0.94 | 0.18 |
| COMPARATIVE EXAMPLE 3 | 14.2 | 679 | 31.3 | 21.3 | 0.665 | 1.10 | 0.15 |
| COMPARATIVE EXAMPLE 4 | 15.0 | 645 | 34.0 | 21.9 | 0.685 | 1.10 | 0.24 |
| COMPARATIVE EXAMPLE 5 | 14.6 | 642 | 33.3 | 21.4 | 0.682 | 1.10 | 0.35 |

THIN-FILM SOLAR CELL AND PRODUCTION METHOD FOR THIN-FILM SOLAR CELL

CROSS-REFERENCE TO RELATED APPLICATIONS

This application is a national stage application under 35 U.S.C. 371 of International Application No. PCT/JP2014/066310, filed Jun. 19, 2014, and which claims priority to Japanese Patent Application No. 2013-147092, filed Jul. 12, 2013, the contents of which are incorporated herein by reference in their entirety.

FIELD OF THE INVENTION

The present invention relates to a thin-film solar cell and a method of producing the same.

BACKGROUND OF THE INVENTION

Conventionally, CIS-based thin-film solar cells which utilize, as a p-type light absorption layer, a Group I-III-VI$_2$ compound semiconductor that has a chalcopyrite structure containing Cu, In, Ga, Se and S have been proposed. Solar cells of this type are relatively inexpensive in terms of production cost and have a high absorption coefficient in the visible to near-infrared wavelength range; therefore, such solar cells are expected to exhibit high photoelectric conversion efficiency.

A CIS-based thin-film solar cell is produced by, for example, forming a backside metal electrode layer on a substrate, subsequently forming thereon a p-type light absorption layer composed of a Group I-III-VI$_2$ compound and further sequentially forming an n-type high-resistance buffer layer and a window layer composed of an n-type transparent conductive film.

When Ga and In are used as Group III elements forming the p-type light absorption layer, the ratio between Ga having a large energy gap and In having a smaller energy gap than Ga is adjusted, and the energy gap of the p-type light absorption layer is thereby set.

It has been reported that Ga causes defects in the p-type light absorption layer and this leads to a reduction in the photoelectric conversion efficiency.

Thus, it has been proposed to reduce the recombination centers in p-n junctions and thereby improve the photoelectric conversion efficiency by reducing the Ga concentration in the p-type light absorption layer toward the n-type high-resistance buffer layer and thus reducing defects in the surface of the p-type light absorption layer on the side of the n-type high-resistance buffer layer.

Further, with regard to the composition ratio of the Group I element(s) and the Group III element(s), it has been proposed to control the composition ratio at lower than 1.0 so as to improve the photoelectric conversion efficiency (see Patent Document 1).

It has been reported that when the ratio of a Group I element, which is a metal element such as Cu, with respect to a Group III element(s) is 1.0 or higher, the p-type polarity of the p-type light absorption layer is affected and the photoelectric conversion efficiency is consequently reduced. For example, it has been proposed to set the ratio of a Group I element(s) with respect to a Group III element(s) at 0.86 to 0.98 (see Patent Document 2 and Non-patent Document 1).

PRIOR ART REFERENCES

Patent Documents

[Patent Document 1] Japanese Laid-open Patent Publication No. H10-135498
[Patent Document 2] Japanese Laid-open Patent Publication No. 2006-49768

Non-Patent Document

[Non-patent Document 1] Solar Energy Materials and Solar Cells, 2011, Vol. 95, Issue 2, 721-726

SUMMARY OF THE INVENTION

As described above, in conventional CIS-based thin-film solar cells, in order to improve photoelectric conversion efficiency, a variety of measures have been proposed with respect to the structure of the p-type light absorption layer; however, a thin-film solar cell having an even higher photoelectric conversion efficiency is desired.

In view of the above, an object of the present specification is to provide a thin-film solar cell having improved photoelectric conversion efficiency.

Another object of the present specification is to provide a method of producing a thin-film solar cell having improved photoelectric conversion efficiency.

Means for Solving the Problems

The thin-film solar cell disclosed in the present specification includes: a substrate; a first electrode layer arranged on the substrate; a p-type light absorption layer formed by a Group I-III-VI$_2$ compound arranged on the first electrode layer; and an n-type second electrode layer arranged on the p-type light absorption layer, wherein the p-type light absorption layer includes Cu as a Group I element and Ga and In as Group III elements, the ratio of the number of atoms between Cu and the Group III elements in the entire p-type light absorption layer is lower than 1.0, the ratio of the number of atoms between Ga and the Group III elements in the surface on the second electrode layer side is 0.13 or lower and the ratio of the number of atoms between Cu and the Group III elements in the surface on the second electrode layer side is 1.0 or higher.

Further, the method of producing a thin-film solar cell disclosed in the present specification includes: a first step of forming a first electrode layer on a substrate; a second step of forming a p-type light absorption layer containing a Group I-III-VI$_2$ compound on the first electrode layer; and a third step of forming an n-type second electrode layer on the p-type light absorption layer, wherein the p-type light absorption layer includes Cu as a Group I element and Ga and In as Group III elements and, in the second step, the p-type light absorption layer is formed such that the ratio of the number of atoms between Cu and the Group III elements in the entire p-type light absorption layer is lower than 1.0, the ratio of the number of atoms between Ga and the Group III elements in the surface on the second electrode layer side is 0.13 or lower and the ratio of the number of atoms between Cu and the Group III elements in the surface on the second electrode layer side is 1.0 or higher.

According to the thin-film solar cell disclosed in the present specification, improved photoelectric conversion efficiency can be attained.

Further, according to the method of producing a thin-film solar cell that is disclosed in the present specification, a thin-film solar cell having improved photoelectric conversion efficiency is obtained.

BRIEF DESCRIPTION OF THE DRAWINGS

FIG. 3 is a flow chart that describes the step of producing a p-type light absorption layer according to one embodiment of the thin-film solar cell production method disclosed in the present specification.

FIG. 5 summarizes the measurement results of the photoelectric conversion efficiency in Examples and Comparative Examples.

A preferred embodiment of the thin-film solar cell disclosed in the present specification will now be described referring to the figures. However, it should be noted that the technical scope of the present invention is not restricted thereto and extends to the inventions described in claims as well as equivalents thereof.

Figure 1:
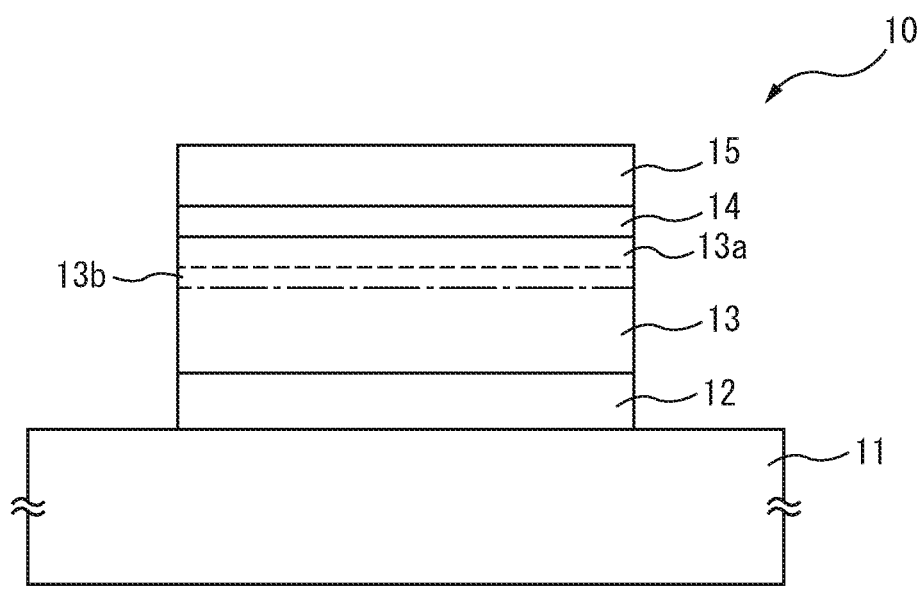
FIG. 1 is a drawing that illustrates the cross-sectional structure of the thin-film solar cell disclosed in the present specification according to one embodiment.

FIG. 1 is a drawing that illustrates the cross-sectional structure of the thin-film solar cell disclosed in the present specification according to one embodiment.

A thin-film solar cell 10 includes: a substrate 11; a first electrode layer 12 arranged on the substrate 11; a p-type light absorption layer 13 arranged on the first electrode layer 12; a transparent high-resistance buffer layer 14 that is arranged on the p-type light absorption layer 13 and has an n-type conductivity; and a second electrode layer 15 arranged on the buffer layer 14. The thin-film solar cell 10 receives light from the side of the second electrode layer 15 and generates electricity.

As the substrate 11, for example, a glass substrate such as a soda lime glass or a low-alkali glass, a metal substrate such as a stainless steel sheet, or a polyimide resin substrate can be used. As the first electrode layer 12, for example, a metal conductive layer made of a metal such as Mo, Cr or Ti can be used.

The p-type light absorption layer 13 is formed by a Group I-III-VI$_2$ compound. The p-type light absorption layer 13 contains: Cu as a Group I element; Ga and In as Group III elements; and Se and S as Group VI elements.

The thin-film solar cell 10 has a high photoelectric conversion efficiency because the ratio of the number of atoms between the Group I element, Cu, and the Group III elements as well as the ratio of the number of atoms between Ga and the Group III elements are within the respective ranges described below.

First, the ratio of the number of atoms between the Group I element, Cu, and the Group III elements will be described.

In the entire p-type light absorption layer 13, the ratio C1 of the number of atoms between Cu and the Group III elements (atomic ratio of Cu with respect to the Group III elements: the number of Cu atoms/the number of Group III element atoms) is lower than 1.0. When the ratio C1 is 1.0 or higher, the photoelectric conversion efficiency may be reduced. Meanwhile, the lower limit value of the ratio C1 can be 0.86. From the standpoint of forming a p-type light absorption layer having an appropriate carrier concentration, it is preferred that the ratio C1 be higher than 0.86.

From the standpoint of further improving the photoelectric conversion efficiency, it is preferred that the ratio C1 be in a range of 0.86 to 0.98, particularly 0.91 to 0.96.

Further, in the p-type light absorption layer 13, the ratio C2 of the number of atoms between Cu and the Group III elements (atomic ratio of Cu with respect to the Group III elements: the number of Cu atoms/the number of Group III element atoms) in the surface on the second electrode layer 15 side, i.e., in the surface on the buffer layer 14 side, is 1.0 or higher. In the p-type light absorption layer 13, the "surface on the buffer layer 14 side" is the part forming an interface with the buffer layer 14. The thin-film solar cell 10 is capable of attaining a high photoelectric conversion efficiency because not only the ratio C2 is 1.0 or higher but also the ratio of the number of atoms between Ga and the Group III elements (atomic ratio of Ga with respect to the Group III elements: the number of Ga atoms/the number of Group III element atoms) in the surface of the p-type light absorption layer 13 on the second electrode layer 15 side is 0.13 or lower and the ratio of the number of atoms between Cu and the Group III elements in the entire p-type light absorption layer 13 is lower than 1.0.

In the present specification, the "surface of the p-type light absorption layer 13 on the second electrode layer 15 side" where the ratio C2 is prescribed refers to only the surface or a region 13$a$ that includes the surface and its vicinity.

Specifically, in the thickness direction of the p-type light absorption layer 13, the region 13$a$ can be defined as a portion of preferably 5%, more preferably 3%, still more preferably 1% of the thickness of the p-type light absorption layer 13 from the surface on the second electrode layer 15 side.

As described above, from the standpoint of improving the photoelectric conversion efficiency, the ratio C2 of the number of atoms between Cu and the Group III elements in the surface on the second electrode layer 15 side is 1.0 or higher.

When the ratio C2 is increased, the electric characteristics of the p-type light absorption layer 13 are approximated to those of a conductor. Therefore, from the standpoint of allowing the p-type light absorption layer 13 to maintain the electric characteristics of a semiconductor, it is preferred that the ratio C2 be not higher than 1.25.

Next, the ratio of the number of atoms between Ga and the Group III elements will be described.

From the standpoint of improving the photoelectric conversion efficiency, it is preferred that the ratio G1 of the number of atoms between Ga and the Group III elements (atomic ratio of Ga with respect to the Group III elements: the number of Ga atoms/the number of Group III element atoms) in the entire p-type light absorption layer 13 be in a range of 0.35 to 0.45.

Further, in the p-type light absorption layer 13, from the standpoint of reducing defects in the surface on the second electrode layer 15 side and thereby improving the photoelectric conversion efficiency, it is preferred that the ratio G2 of the number of atoms between Ga and the Group III elements (atomic ratio of Ga with respect to the Group III elements: the number of Ga atoms/the number of Group III element atoms) in the surface on the buffer layer 14 side, i.e., in the surface on the second electrode layer 15 side, be 0.13 or lower. The lower limit value of the ratio G2 can be 0. By reducing the Ga concentration in the surface, the number of recombination centers can also be reduced.

In the present specification, the "surface of the p-type light absorption layer 13 on the second electrode layer 15 side" where the ratio G2 is prescribed means only the surface itself or a region 13b that includes the surface and its vicinity.

The region 13b may be the same as or different from the above-described region 13a.

Specifically, in the thickness direction of the p-type light absorption layer 13, the region 13b can be defined as a portion of preferably 5%, more preferably 3%, still more preferably 1% of the thickness of the p-type light absorption layer 13 from the surface on the second electrode layer 15 side.

A preferred embodiment of the thin-film solar cell production method disclosed in the present specification will now be described referring to FIGS. 2 to 4.

First, the first electrode layer 12 is formed on the substrate 11. The thickness of the first electrode layer 12 can be, for example, 200 to 500 nm. The first electrode layer 12 is formed by, for example, a DC sputtering method using Mo as a material. The film-forming conditions of the DC sputtering method can be set as follows: film-forming pressure=1.2 to 2.5 Pa, applied power=1.0 to 3.0 W/cm$^2$.

Next, the p-type light absorption layer 13 containing a Group I-III-VI$_2$ compound is formed on the first electrode layer 12.

Examples of a method of forming the p-type light absorption layer 13 include (1) a method of forming metal precursor films of a Group I element and Group III elements and subsequently forming a compound of the resulting metal precursor films and a Group VI element; and (2) a method of forming a film by vapor deposition using Group I, III and VI elements.

First, a process of forming the p-type light absorption layer 13 using the method (1) of forming metal precursor films of a Group I element and Group III elements and subsequently forming a compound of the resulting metal precursor films and a Group VI element will be described.

The basic idea of the method (1) is to form, on the first electrode layer 12, first a Ga and Cu-containing precursor film and then an In-containing precursor film and subsequently form a compound composed of the Ga and Cu-containing precursor film, the In-containing precursor film and a Group VI element.

As for Cu which is a Group I element, as described above, a precursor film containing mixed crystals of Ga and Cu may be formed, or a Cu-containing precursor film may be laminated on a Ga-containing precursor film.

In this manner, the ratio C2 of the number of atoms between Cu and the Group III elements in the surface of the p-type light absorption layer 13 on the second electrode layer 15 side can be controlled to be 1.0 or higher and the ratio G2 of the number of atoms between Ga and the Group III elements in the surface on the second electrode layer 15 side can be controlled to be lower than 0.13. Further, the ratio G2 of the number of atoms between Ga and the Group III elements in the surface can also be reduced by shortening the time of a heat treatment performed for the formation of a compound with a Group VI element or by adding an alkali compound (for example, addition into a precursor film or diffusion from the substrate).

Next, examples where metal precursor films of a Group I element and Group III elements are formed will be described referring to FIGS. 2A to 2C.

Figure 2A:
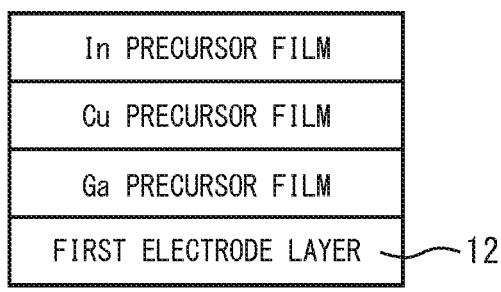
FIG. 2A is a cross-sectional view that illustrates the step of producing a p-type light absorption layer according to one embodiment of the thin-film solar cell production method disclosed in the present specification.

In the example depicted in FIG. 2A, a Ga precursor film is first formed on the first electrode layer 12, and a Cu precursor film and then an In precursor film are formed thereon.

Figure 2B:
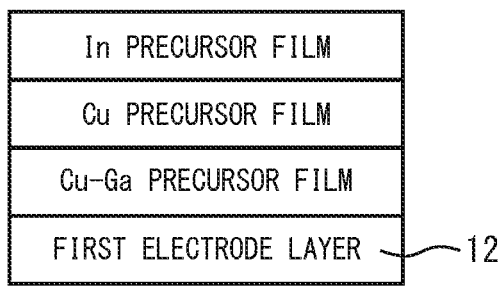
FIG. 2B is a cross-sectional view that illustrates the step of producing a p-type light absorption layer according to one embodiment of the thin-film solar cell production method disclosed in the present specification.

In the example depicted in FIG. 2B, a Cu—Ga precursor film, which is composed of mixed crystals of Ga and Cu, is first formed on the first electrode layer 12, and a Cu precursor film and then an In precursor film are formed thereon.

Figure 2C:
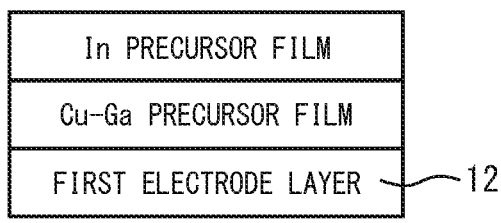
FIG. 2C is a cross-sectional view that illustrates the step of producing a p-type light absorption layer according to one embodiment of the thin-film solar cell production method disclosed in the present specification.

In the example depicted in FIG. 2C, a Cu—Ga precursor film, which is composed of mixed crystals of Ga and Cu, is first formed on the first electrode layer 12, and an In precursor film is then formed thereon.

In the present specification, the term "Ga and Cu-containing precursor film" includes films formed by laminating a Ga precursor film and a Cu precursor film as depicted in FIG. 2A as well as Cu—Ga precursor films composed of mixed crystals of Ga and Cu as depicted in FIG. 2C.

The precursor films can each be formed by a known film-forming technology such as sputtering.

Next, the process of forming a compound of a metal precursor film and a Group VI element will be described referring to FIG. 3.

The present inventors discovered that in the formation of a compound between a Cu-containing precursor film and Se which is a Group VI element, the Cu concentration in the surface of the precursor film can be controlled by adjusting the Se concentration in a reaction gas. The selenization process of forming a compound between a precursor film and Se is carried out based on this discovery.

This Se concentration in the reaction gas used in the selenization process of forming a compound between a precursor film and Se is adjusted as described below.

First, in the step S1, using an Se-containing reaction gas having a prescribed concentration, a compound composed of a precursor film for adjustment and Se, which precursor film has the same structure as a laminated film in which a Ga and Cu-containing precursor film and an In precursor film are laminated as shown in FIGS. 2A to 2C, is formed and the ratio of the number of atoms between Cu and the Group III elements in the surface of the precursor film for adjustment is determined. The precursor film for adjustment is a film which is separately formed such that it has the same structure as a laminated film obtained by laminating a Ga and Cu-containing precursor film and an In precursor film.

The term "surface of the precursor film for adjustment" used herein means the part corresponding to the region 13a depicted in FIG. 1.

Next, in the step S2, the ratio determined in the step S1 and the desired ratio of the number of atoms between Cu and the Group III elements are compared. In the surface of the p-type light absorption layer, the desired ratio of the number of atoms between Cu and the Group III elements is 1.0 or higher but preferably lower than 1.25.

When the ratio determined in the step S1 is lower than the desired ratio of the number of atoms between Cu and the Group III elements, the process proceeds to the step S3. Alternatively, when the ratio determined in the step S1 is higher than the desired ratio of the number of atoms between Cu and the Group III elements, the process proceeds to the step S4, or when the ratio determined in the step S1 is within an acceptable range with respect to the desired ratio of the number of atoms between Cu and the Group III elements, the process proceeds to the step S5.

When the process proceeded to the step S3, the Se concentration in the reaction gas is adjusted to be lower than the prescribed concentration. The process then proceeds to the step S6.

When the process proceeded to the step S4, the Se concentration in the reaction gas is adjusted to be higher than the prescribed concentration. The process then proceeds to the step S6.

Next in the step S6, using the reaction gas having the thus adjusted Se concentration, a compound composed of other precursor film for adjustment and Se, which other precursor film has the same structure as a laminated film obtained by laminating a Ga and Cu-containing precursor film and an In precursor film, is formed. This other precursor film for adjustment is a film which is formed separately from the precursor film for adjustment used in the step 1.

Subsequently, in the step S7, the ratio of the number of atoms between Cu and the Group III elements in the surface of this other precursor film for adjustment is determined. The process then returns to the step S2. Thereafter, the above-described operations of the steps S2 to S7 are repeated. It is noted here that the "prescribed concentration" in the steps S3 and S4 is replaceable with the adjusted concentration used in the step S6.

When the process proceeded to the step S5, the Se concentration of the reaction gas is already adjusted to yield a desired ratio C2. Then, using the reaction gas having the adjusted Se concentration, a compound is formed between a laminated film, in which a Ga and Cu-containing precursor film and an In precursor film are laminated, and Se under a prescribed temperature (selenization). In this manner, the ratio C2 of the number of atoms between Cu and the Group III elements in the surface of the p-type light absorption layer 13 on the second electrode layer 15 side can be controlled to be 1.0 or higher but preferably lower than 1.25. It is noted here that the adjusted Se concentration may vary depending on the reactor used for the reaction.

Thereafter, if necessary, the thus selenized laminated film is allowed to form a compound with S, which is a Group VI element (sulfurization).

Thus far, the process of forming a p-type light absorption layer using the method (1) has been described. The ratio C1 of the number of atoms between Cu and the Group III elements in the entire p-type light absorption layer can be adjusted by controlling the number of Cu atoms and that of the Group III element atoms in the precursor films to be laminated, for example, by changing the thickness ratio of the Cu—Ga precursor film and the In precursor film or the thickness ratio of the Cu—Ga precursor film and the Cu precursor film.

Next, a process of forming the p-type light absorption layer 13 using the method (2) of forming a film by vapor deposition using Group I, III and VI elements will be described.

The basic idea of the method (2) is to form the p-type light absorption layer 13 by, in the vapor deposition on the first electrode layer 12 using Group I, III and VI elements as vapor deposition sources, performing vapor deposition of Ga before vapor deposition of In as vapor deposition of Group III elements so as to form a semiconductor layer having a chalcopyrite structure in which the ratio G2 of the number of atoms between Ga and the Group III elements (atomic ratio in the surface of the p-type light absorption layer 13) is lower than 0.13 and subsequently performing vapor deposition of Cu alone on the thus formed semiconductor layer. In this manner, not only the ratio C2 of the number of atoms between Cu and the Group III elements in the surface of the p-type light absorption layer 13 on the second electrode layer 15 side can be controlled to be 1.0 or higher, but also the ratio G2 of the number of atoms between Ga and the Group III elements in the surface on the second electrode layer 15 side can be controlled to be lower than 0.13. Further, the ratio G2 of the number of atoms between Ga and the Group III elements in the surface can also be reduced by shortening the time of a heat treatment performed for the vapor deposition of a Group VI element or by adding an alkali compound (vapor deposition using an alkali compound as a vapor deposition source or diffusion of an alkali compound from the substrate).

The p-type light absorption layer may also be formed by further vapor-depositing Cu, which is a Group I element, in the form of a vapor deposition film containing Cu and Ga or In or using a vapor deposition source containing Cu and S or Se.

As for Se or S which is a Group VI element, an Se film, an S film or an Se and S-containing film can be formed by vapor deposition on an In film.

Figure 4A:
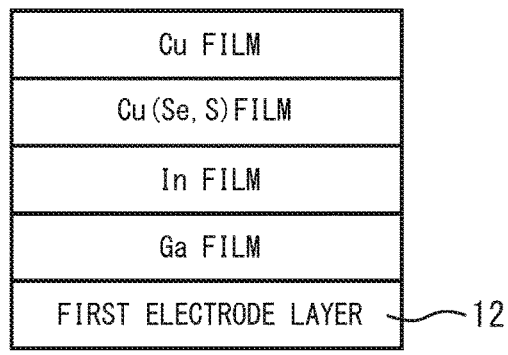
FIG. 4A is a cross-sectional view that illustrates another example of the step of producing a p-type light absorption layer according to one embodiment of the thin-film solar cell production method disclosed in the present specification.
Figure 4B:
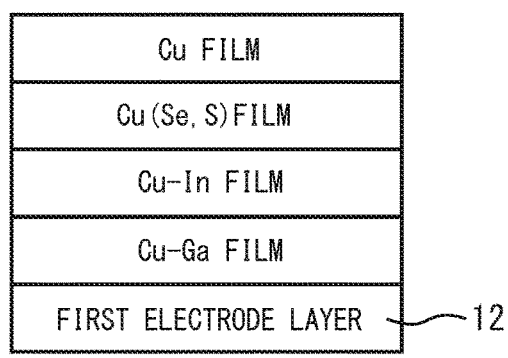
FIG. 4B is a cross-sectional view that illustrates yet another example of the step of producing a p-type light absorption layer according to one embodiment of the thin-film solar cell production method disclosed in the present specification.
Figure 4C:
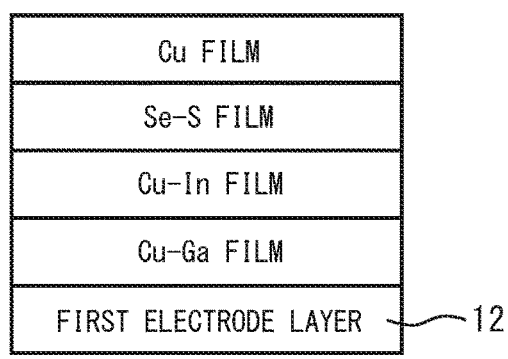
FIG. 4C is a cross-sectional view that illustrates yet another example of the step of producing a p-type light absorption layer according to one embodiment of the thin-film solar cell production method disclosed in the present specification.

Next, examples of forming a p-type light absorption layer will be described referring to FIGS. 4A to 4C.

In the example depicted in FIG. 4A, on the first electrode layer 12, Ga is first vapor-deposited and In is subsequently vapor-deposited thereon. Then, Cu(Se,S) containing Se, S and Cu is vapor-deposited, and Cu alone is finally vapor-deposited. By the heat applied during the vapor deposition of Cu(Se,S), a compound of Cu, Se or S, In and Ga is formed. In addition, after the vapor deposition of Cu, a heat treatment may be performed so as to form a compound of Cu, Se or S, In and Ga. In place of the vapor deposition of Cu(Se,S), a vapor deposition source of Se and S, an Se, S and Cu-containing vapor deposition source, or an Se and Cu-containing vapor deposition source and a vapor deposition source of S, can be used as well. For the vapor deposition, for example, a multi-source simultaneous vapor deposition method can be employed.

In the example depicted in FIG. 4B, on the first electrode layer 12, Cu and Ga (or a CuGa compound) are first vapor-deposited, and Cu and In (or a CuIn compound) are subsequently vapor-deposited thereon. Then, Se, S and Cu (or a CuSeS compound) are vapor-deposited and Cu alone is finally vapor-deposited. By the heat applied during the vapor deposition of Cu(Se,S), a compound of Cu, Se or S, In and Ga is formed. In addition, after the vapor deposition of Cu, a heat treatment may be performed so as to form a compound of Cu, Se or S, In and Ga.

In the example depicted in FIG. 4C, on the first electrode layer 12, Cu and Ga (or a CuGa compound) are first vapor-deposited, and Cu and In (or a CuIn compound) are subsequently vapor-deposited thereon. Then, Se and S (or an SeS compound) are vapor-deposited and Cu alone is finally vapor-deposited. By the heat applied during the vapor deposition of Se—S, a compound of Cu, Se or S, In and Ga is formed. In addition, after the vapor deposition of Cu, a heat treatment may be performed so as to form a compound of Cu, Se or S, In and Ga.

In the above, the process of forming a p-type light absorption layer using the method (2) was described.

Subsequently, the buffer layer 14 is formed on the p-type light absorption layer 13 formed in the above-described manner.

As the buffer layer 14, for example, a transparent and high-resistance 2 to 50 nm-thick $Zn(O,S,OH)_x$ film having an n-type conductivity can be formed. This buffer layer 14 can be prepared by a chemical bath deposition method or an MOCVD method. Alternatively, as the buffer layer 14, for example, a Group II-VI compound semiconductor thin film composed of CdS, ZnS, ZnO or the like, a film made of $Zn(O,S)_x$ or the like which is a mixed crystal of the above-described Group II-VI compounds, or an In-based compound semiconductor thin film composed of $In_2O_3$, $In_2S_3$, $In(OH)_x$ or the like can also be used.

Thereafter, on the buffer layer 14, the second electrode layer 15 is formed.

As the second electrode layer 15, for example, a transparent and low-resistance 0.2 to 2.5 µm-thick conductive film which is composed of ZnO:B and has an n-type conductivity and a broad forbidden band width can be formed. This second electrode layer 15 can be prepared by a sputtering method or an MOCVD method. In addition, as the second electrode layer 15, for example, ZnO:Al or ZnO:Ga can be used, and a transparent conductive film composed of ITO may also be used.

EXAMPLES

The thin-film solar cell disclosed in the present specification will be further described below by way of working examples thereof. However, the scope of the present invention is not restricted thereto.

The thin-film solar cell of Example 1 was produced as described below. As the substrate 11, a glass substrate was used. The first electrode layer 12 was formed by a sputtering method using Mo.

The p-type light absorption layer 13 was formed by the above-described method (1). As a Group I element, Cu was used. As Group III elements, Ga and In were used and, as Group VI elements, Se and S were used. The p-type light absorption layer 13 was prepared by forming, as precursor films on the first electrode layer, first a CuGa film by a sputtering method, next a Cu film by a sputtering method and then an In film by a sputtering method. The resulting laminate of the thus formed precursor films was subjected to selenization and sulfurization. The buffer layer 14 was formed by a chemical bath deposition method using $Zn(O,S,OH)_x$. The second electrode layer 15 was formed by an MOCVD method using ZnO:B (boron-doped zinc oxide). The ratio C1 of the number of atoms between Cu and the Group III elements in the entire p-type light absorption layer 13 was in a range of 0.86 to 0.98. The ratio C2 of the number of atoms between Cu and the Group III elements in the surface of the p-type light absorption layer 13 on the second electrode layer 15 side was 1.00. The ratio G1 of the number of atoms between Ga and the Group III elements in the entire p-type light absorption layer 13 was in a range of 0.35 to 0.45. The ratio G2 of the number of atoms between Ga and the Group III elements in the surface of the p-type light absorption layer 13 on the second electrode layer 15 side was 0.06. These ratios of the number of atoms were determined by measuring the number of the respective atoms by glow discharge spectrometry while grinding the sample surface by a sputtering method.

The thin-film solar cell of Example 2 was obtained in the same manner as in Example 1, except that the ratio C2 was 1.10 and the ratio G2 was 0.07. The ratio G2 of 0.07 is substantially the same as in Example 1; however, Example 2 is different from Example 1 in that the ratio of the number of atoms between Cu and the Group III elements in the formation of the precursor films was increased so as to control the ratio C2 to be 1.10.

The thin-film solar cell of Example 3 was obtained in the same manner as in Example 2, except that the ratio G2 was 0.13. Example 3 is different from Example 2 in that the processing time for the formation of the p-type light absorption layer, in other words, the time of the heat treatment performed for the formation of a compound with the Group VI elements, was made longer than that of Example 1 so as to control the ratio G2 to be 0.13.

The thin-film solar cell of Comparative Example 1 was obtained in the same manner as in Example 1, except that the ratio C2 was 0.94 and the ratio G2 was 0.10. Comparative Example 1 is different from Example 1 in that the selenium concentration in the selenization was increased as described below so as to control the ratio C2 to be 0.94 and that the processing time for the formation of the p-type light absorption layer was extended so as to control the ratio G2 to be 0.10.

The thin-film solar cell of Comparative Example 2 was obtained in the same manner as in Comparative Example 1, except that the ratio G2 was 0.18. Comparative Example 2 is different from Comparative Example 1 in that the processing time for the formation of the p-type light absorption layer was extended so as to control the ratio G2 to be 0.18.

The thin-film solar cell of Comparative Example 3 was obtained in the same manner as in Example 3, except that the ratio G2 was 0.15. Comparative Example 3 is different from Example 3 in that the processing time for the formation of the p-type light absorption layer was extended so as to control the ratio G2 to be 0.15.

The thin-film solar cell of Comparative Example 4 was obtained in the same manner as in Example 3, except that the ratio G2 was 0.24. Comparative Example 4 is different from Example 3 in that the processing time for the formation of the p-type light absorption layer was extended so as to control the ratio G2 to be 0.24.

The thin-film solar cell of Comparative Example 5 was obtained in the same manner as in Example 3, except that the ratio G2 was 0.35. Comparative Example 5 is different from Example 3 in that the processing time for the formation of the p-type light absorption layer was extended so as to control the ratio G2 to be 0.35.

In the process of producing the p-type light absorption layers of Comparative Examples 1 and 2, the $H_2Se$ concentration in the reaction gas used for selenization was 1.1% by volume and, in the process of producing the p-type light absorption layers of Examples 1 to 3 and Comparative Examples 3 to 5, the H$_2$Se concentration in the reaction gas used for selenization was 0.9% by volume. As the reaction gas, a mixed gas of H$_2$Se and nitrogen was used.

In Examples 1 to 3, the ratio C2 (1.00 to 1.10) was 1.0 or higher and the ratio G2 (0.06 to 0.13) was 0.13 or lower.

In Comparative Examples 1 and 2, the ratio C2 (0.94) was lower than 1.0. In Comparative Examples 2 to 5, the ratio G2 (0.18 to 0.35) was higher than 0.13.

For the thin-film solar cells of Examples 1 to 3 and Comparative Examples 1 to 5, the photoelectric conversion efficiency (Eff), the open-circuit voltage (Voc/cell), the current density (Jsc), the product of open-circuit voltage and current density (Voc/cell×Jsc) and the fill factor (FF) were evaluated. The evaluation results are summarized in FIG. 5.

The repeatability error in the measurement of the photoelectric conversion efficiency (Eff) is within about ±2% and at a photoelectric conversion efficiency (Eff) of 15%, the repeatability error is within about ±0.3%. Further, when the same thin-film solar cells are produced and their photoelectric conversion efficiencies (Eff) are measured, the error attributed to the reproducibility is affected by calcination and the like; therefore, this error may be larger than the repeatability error.

In all of Examples 1 to 3, the photoelectric conversion efficiency was not lower than 15.5%, which was higher by at least 0.5% than in any of Comparative Examples 1 to 5. In addition, with regard to the fill factor (FF) as well, the thin-film solar cells of Examples 1 to 3 exhibited a value equal to or higher than the values exhibited by the thin-film solar cells of Comparative Examples 1 to 5.

In Comparative Example 1, it is believed that the photoelectric conversion efficiency (Eff) was lower than those of Examples 1 to 3 because the ratio C2 (0.94) was lower than 1.0 although the ratio G2 (0.10) was lower than 0.13.

Figure 6:
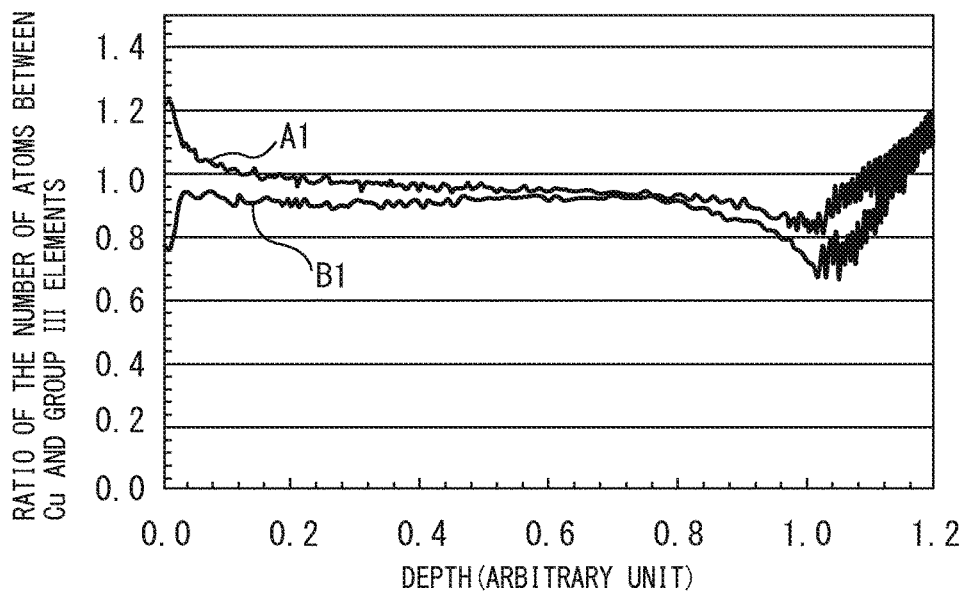
FIG. 6 is a graph representing the depth-direction distribution of the ratio of the number of atoms between Cu and Group III elements in the respective p-type light absorption layers of Example 2 and Comparative Example 1.

The depth-direction distributions of the ratio of the number of atoms between Cu and the Group III elements in the respective p-type light absorption layers of Example 2 and Comparative Example 1 are represented in FIG. 6.

FIG. 6 indicates the results of determining the relationship between the ratio, the number of Cu atoms/(the number of Ga+In atoms), and the depth of each p-type light absorption layer by measuring the number of Cu, Ga and In atoms based on glow discharge spectrometry while grinding the sample surface by a sputtering method. The value of "(the number of Ga+In atoms)" means the number of the Group III element atoms. The abscissa of FIG. 6 represents the depth of the p-type light absorption layer from the surface of the buffer layer side. A value of 0.0 on the abscissa corresponds to the position of the surface of the p-type light absorption layer on the buffer layer side, and a value of 1.0 on the abscissa corresponds to the position of the surface on the first electrode layer side. The ordinate of FIG. 6 represents the ratio, the number of Cu atoms/(the number of Ga+In atoms).

The curve A1 represents the measurement results for Example 2, while the curve B1 represents the measurement results for Comparative Example 1.

The curve A1 rises from a depth of about 0.1 (10% of the thickness of the p-type light absorption layer) toward a depth of 0.0 (the surface of the buffer layer side) and particularly, a rapid rise starts at a depth of about 0.05 (5% of the thickness of the p-type light absorption layer). Specifically, the curve A1 indicates a value of 1.0 or greater at a depth of about 0.1 (10% of the thickness of the p-type light absorption layer), rising to a value of 1.1 or greater at a depth of about 0.05. It is thus seen that, in the p-type light absorption layer of Example 2, the ratio C2 of the number of atoms between Cu and the Group III elements is 1.0 or higher in the part corresponding to 5% of the thickness of the p-type light absorption layer from the surface on the buffer layer side.

The curve B1 indicates substantially constant values; however, it rapidly decreases from a depth of about 0.04 toward a depth of 0.0 (the surface of the buffer layer side). Specifically, the curve B1 indicates values of about 0.9 throughout a depth of 1.0 to a depth of 0.04 but decreases to a value of less than 0.8 from a depth of 0.04 toward a depth of 0.0.

Figure 7:
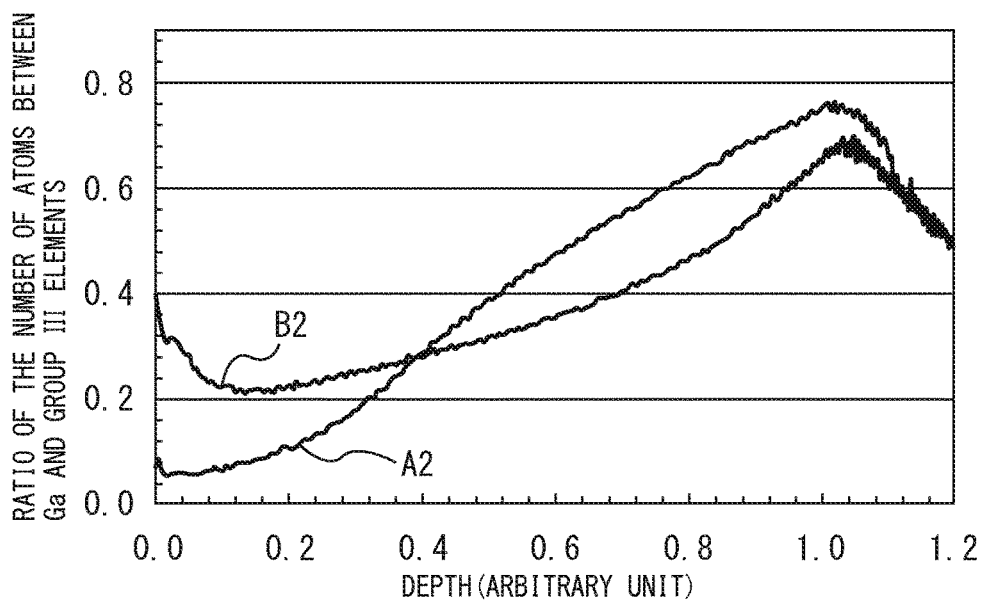
FIG. 7 is a graph representing the depth-direction distribution of the ratio of the number of atoms between Ga and Group III elements in the respective p-type light absorption layers of Example 1 and Comparative Example 5.

The depth-direction distributions of the ratio of the number of atoms between Ga and the Group III elements in the respective p-type light absorption layers of Example 1 and Comparative Example 5 are represented in FIG. 7.

FIG. 7 indicates the results of determining the relationship between the ratio, the number of Ga atoms/(the number of Ga+In atoms), and the depth of each p-type light absorption layer by measuring the number of Ga and In atoms based on glow discharge spectrometry while grinding the sample surface by a sputtering method. The abscissa of FIG. 7 represents the depth of the p-type light absorption layer from the surface of the buffer layer side. The value of 0.0 on the abscissa corresponds to the position of the surface of the p-type light absorption layer on the buffer layer side, and the value of 1.0 on the abscissa corresponds to the position of the surface on the first electrode layer side. The ordinate of FIG. 7 represents the ratio, the number of Ga atoms/(the number of Ga+In atoms).

The curve A2 represents the measurement results for Example 1, while the curve B2 represents the measurement results for Comparative Example 5.

The curve A2 indicates values of 0.1 or less throughout a depth of 0.20 to a depth of 0.0 (the surface of the buffer layer side). It is thus seen that in the p-type light absorption layer of Example 1, the ratio C2 of the number atoms between Ga and the Group III elements is 0.13 or lower in the part corresponding to 5% of the thickness of the p-type light absorption layer from the surface on the buffer layer side.

The curve B2 indicates values of 0.2 or greater over the entirety of the depth direction.

The present inventors believe the reason why the thin-film solar cells of Examples 1 to 3 exhibited superior photoelectric conversion efficiencies (Eff) than the thin-film solar cells of Comparative Examples 1 to 5 is as follows.

In Comparative Examples 2 to 5, although the ratio C2 (1.10) was 1.0 or higher, the ratio G2 (0.15 to 0.35) was higher than 0.13.

In Comparative Example 1, although the ratio G2 (0.10) was 0.13 or lower, the ratio C2 (0.94) was lower than 1.0.

Accordingly, for expression of a favorable photoelectric conversion efficiency, it is required that the ratio C2 (1.10) be 1.0 or higher and the ratio G2 (0.10) be 0.13 or lower as in Examples 1 to 3.

It is believed that by controlling the ratio G2 to be 0.13 or lower, the Ga concentration in the surface of the p-type light absorption layer 13 on the buffer layer 14 side is reduced and this consequently reduces defects acting as recombination centers, thereby the photoelectric conversion efficiency is improved.

It is also believed that the formation of a Cu-deficient layer in the surface of the p-type light absorption layer 13 on the buffer layer 14 side is inhibited by controlling the ratio C2 at 1.0 or higher. The specific mechanism thereof is unclear; however, it is presumed that by inhibiting the formation of a surface Cu-deficient layer and controlling the ratio G2 at 0.13 or lower, a higher photoelectric conversion efficiency is attained as compared to a case where only the controlling of the ratio G2 at 0.13 or lower is implemented.

According to the thin-film solar cells of the above-described embodiments, improved photoelectric conversion efficiency can be attained.

For an improvement in the photoelectric conversion efficiency, it has been previously proposed to control the composition ratio between a Group I element(s) such as Cu and a Group III element(s) to be lower than 1.0; however, there has been no idea of improving the photoelectric conversion efficiency by controlling this composition ratio at 1.0 or higher. Therefore, it should be noted here that the idea of controlling the ratio C2 to be 1.0 or higher as in the above-described embodiments of the present invention is an unconventional and novel idea.

In the present invention, the thin-film solar cells and the methods of producing a thin-film solar cell according to the above-described embodiments can be modified as appropriate as long as the modification does not deviate from the gist of the present invention. Moreover, the required constituents of one embodiment can be appropriately applied to other embodiments as well.

DESCRIPTION OF SYMBOLS

10 Thin-film solar cell
11 Substrate
12 First electrode layer
13 p-type light absorption layer
13a Region
13b Region
14 Buffer layer
15 Second electrode layer

What is claimed is:

1. A thin-film solar cell comprising:
a substrate;
a first electrode layer arranged on the substrate;
a p-type light absorption layer formed by a Group I-III-VI$_2$ compound arranged on the first electrode layer; and
an n-type second electrode layer arranged on the p-type light absorption layer,
wherein the p-type light absorption layer has a first surface facing the first electrode layer and a second surface facing the n-type second electrode layer and opposite from the first surface,
the p-type light absorption layer comprises Cu as a Group I element and Ga and In as Group III elements,
an atomic ratio of Cu included in the entire p-type light absorption layer over the Group III elements included in the entire p-type light absorption layer is lower than 1.0,
an atomic ratio of Ga present at the second surface of the p-type light absorption layer over the Group III elements present at the second surface of the p-type light absorption layer is 0.13 or lower, and
an atomic ratio of Cu present at the second surface of the p-type light absorption layer over the Group III elements present at the second surface of the p-type light absorption layer is 1.0 or higher.

2. The thin-film solar cell of claim 1, wherein the atomic ratio of Ga over the Group III elements and the atomic ratio of Cu over the Group III elements are maintained, in the thickness direction of the p-type light absorption layer, down to a portion corresponding to 5% of the thickness of the p-type light absorption layer from the second surface of the p-type light absorption layer.

3. The thin-film solar cell of claim 1, wherein the p-type light absorption layer comprises Se and S as Group VI elements.

* * * * *